United States Patent
Fischer et al.

(10) Patent No.: US 7,205,236 B2
(45) Date of Patent: Apr. 17, 2007

(54) SEMICONDUCTOR SUBSTRATE POLISHING METHODS AND EQUIPMENT

(75) Inventors: Paul B. Fischer, Portland, OR (US); Chris E. Barns, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 10/952,655

(22) Filed: Sep. 28, 2004

(65) Prior Publication Data

US 2006/0065633 A1    Mar. 30, 2006

(51) Int. Cl.
*H01L 21/461* (2006.01)
*H01L 21/302* (2006.01)

(52) U.S. Cl. .................. 438/690; 438/691; 438/692; 438/693

(58) Field of Classification Search ............ None
See application file for complete search history.

(56) References Cited

U.S. PATENT DOCUMENTS

| | | | | |
|---|---|---|---|---|
| 5,911,619 | A * | 6/1999 | Uzoh et al. | 451/5 |
| 6,464,855 | B1 | 10/2002 | Chadda et al. | |
| 6,947,862 | B2 * | 9/2005 | Eaton et al. | 702/100 |
| 2005/0003737 | A1 * | 1/2005 | Montierth et al. | 451/5 |
| 2005/0239283 | A1 * | 10/2005 | Horikoshi et al. | 438/633 |
| 2006/0169597 | A1 * | 8/2006 | Liu et al. | 205/680 |

OTHER PUBLICATIONS

Landolt, D., Review Article: Fundamental Aspects Of Electropolishing, Electrochimica Acta, The Journal Of The International Society Of Electrochemistry, vol. 32, no date.
No. 1, Jan. 1987, pp. 1-11, Pergamon Journals Ltd., Printed in Great Britain.

* cited by examiner

*Primary Examiner*—Duy-Vu N Deo
(74) *Attorney, Agent, or Firm*—Blakely, Sokoloff, Taylor & Zafman LLP

(57) ABSTRACT

According to one aspect of the present invention, a method of electrochemically polishing a semiconductor substrate may be provided. A semiconductor substrate processing fluid, having a plurality of abrasive particles therein, may be placed between the surface of the semiconductor substrate and the polish head. The polish head may be moved relative to the surface of the semiconductor substrate to cause the abrasive particles to polish the surface of the semiconductor substrate. According to a second aspect of the present invention, a method for electro-polishing a semiconductor substrate may be provided. A semiconductor substrate may be placed in an electrolytic solution. A surface of the semiconductor substrate may be contacted with at least one conductive member. A voltage may be applied across the electrolytic solution and the at least one conductive member. The at least one conductive member may be moved across the surface of the semiconductor substrate.

25 Claims, 17 Drawing Sheets

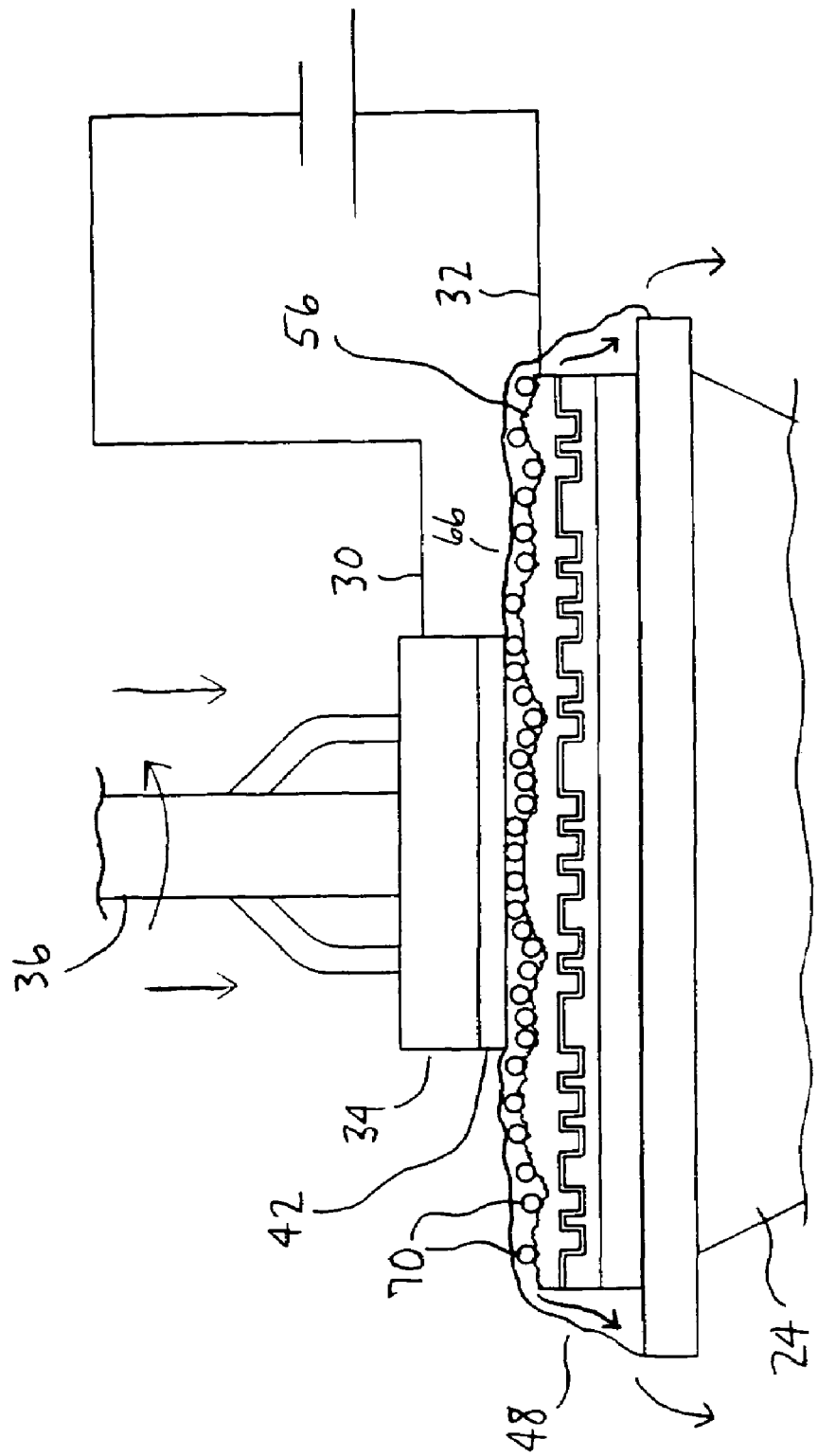

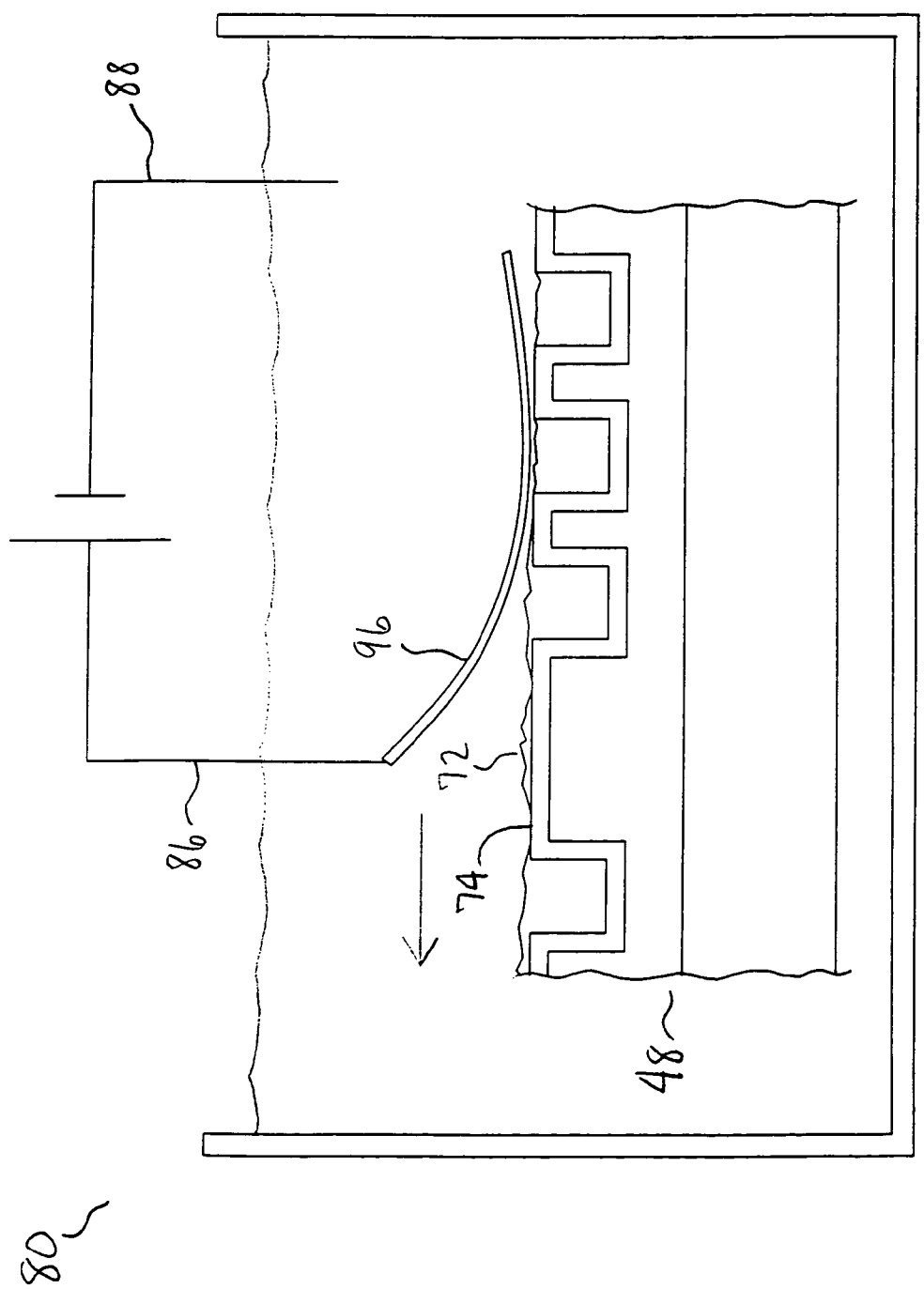

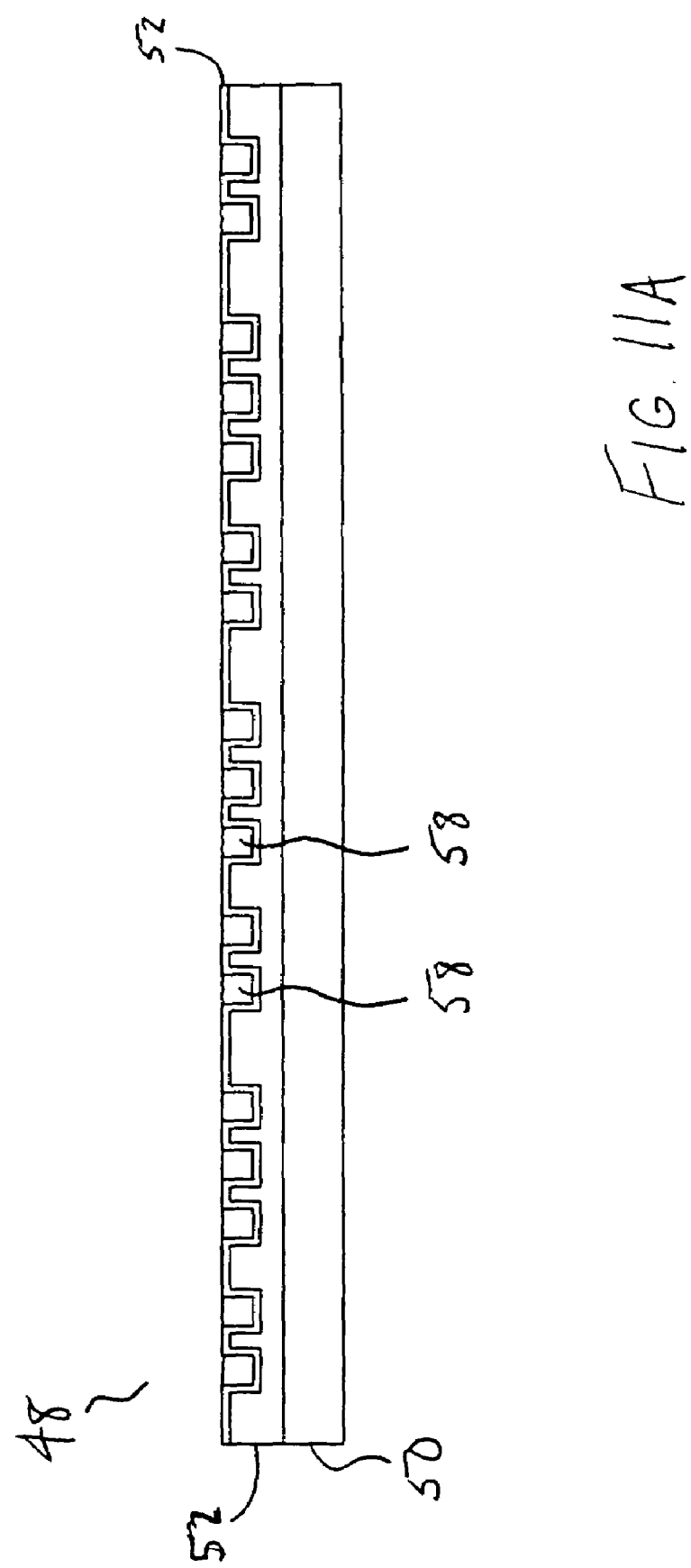

SEMICONDUCTOR SUBSTRATE POLISHING METHODS AND EQUIPMENT

BACKGROUND OF THE INVENTION

1) Field of the Invention

Embodiments of this invention relate to methods and equipment for polishing semiconductor substrates.

2) Discussion of Related Art

Integrated circuits are formed on semiconductor wafers. The wafers are then sawed (or "singulated" or "diced") into microelectronic dice, also known as semiconductor chips, with each chip carrying a respective integrated circuit. Each semiconductor chip is then mounted to a package, or carrier, substrate. Often the packages are then mounted to a motherboard, which may then be installed into a computing system.

Numerous steps may be involved in the creation of the integrated circuits, such as the formation and etching of various semiconductor, insulator, and conductive layers. After the formation of these layers, particularly conductive layers, an upper surface thereof may include alternating raised and recessed roughness formations, i.e., the upper surfaces are not smooth. Before the manufacturing of the integrated circuits can be completed, the upper surfaces of these layers must be polished, or grinded, to remove unwanted material and smooth the upper surfaces (i.e., remove the roughness formations).

Several methods are currently used to polish the semiconductor wafers, such as chemical-mechanical polishing, electrochemical polishing, pure electro-polishing, and chemical etching. Chemical-mechanical polishing often produces shear stresses on the surface of the semiconductor substrate that can damage features on the substrate and insulating layers beneath the conductive layer, particularly when sensitive low-k materials are used. Electro-chemical polishing is often unable to remove all of the desired material. Electro-polishing, which requires an electrical connection to the conductive layer, is also unable to completely remove the unwanted material, as sections of the conductive layer become electrically disconnected from the remainder of the conductive layer. Chemical etching is not able to evenly remove the conductive layer, which may result in some portions of the conductive layer being left on the substrate and some features of the integrated circuits being damaged.

BRIEF DESCRIPTION OF THE DRAWINGS

Embodiments of the invention are described by way of examples with reference to the accompanying drawings, wherein:

FIGS. 6A and 6B are side views of the semiconductor substrate, substrate support, and polish assembly as illustrated in FIG. 4B;

FIG. 10B is a cross-sectional schematic view of the solution container and the semiconductor substrate as illustrated in FIG. 10A;

FIG. 11A is a cross-sectional side view of the semiconductor substrate after having undergone an electrochemical polish.

DETAILED DESCRIPTION OF THE INVENTION

In the following description, various aspects of the present invention will be described, and various details will be set forth in order to provide a thorough understanding of the present invention. However, it will be apparent to those skilled in the arts that the present invention may be practiced with only some or all of the aspects of the present invention, and the present invention may be practiced without the specific details. In other instances, well-known features are omitted or simplified in order not to obscure the present invention.

It should be understood that FIGS. 1–11B are merely illustrative and may not be drawn to scale.

FIG. 1 to FIG. 6B illustrate a method of electrochemically polishing a semiconductor substrate. A polish head may be positioned a distance from a surface of the semiconductor substrate. A semiconductor substrate processing fluid may be placed between the surface of the semiconductor substrate and the polish head. The semiconductor substrate may have a plurality of abrasive particles therein. The abrasive particles may have widths which are approximately the same as the distance between the polish head and surface of the semiconductor substrate. At least some of the abrasive particles may contact the surface of the semiconductor substrate and the polish head. The polish head may be moved relative to the surface of the semiconductor substrate to cause the abrasive particles to polish the surface of the semiconductor substrate.

Figure 1:
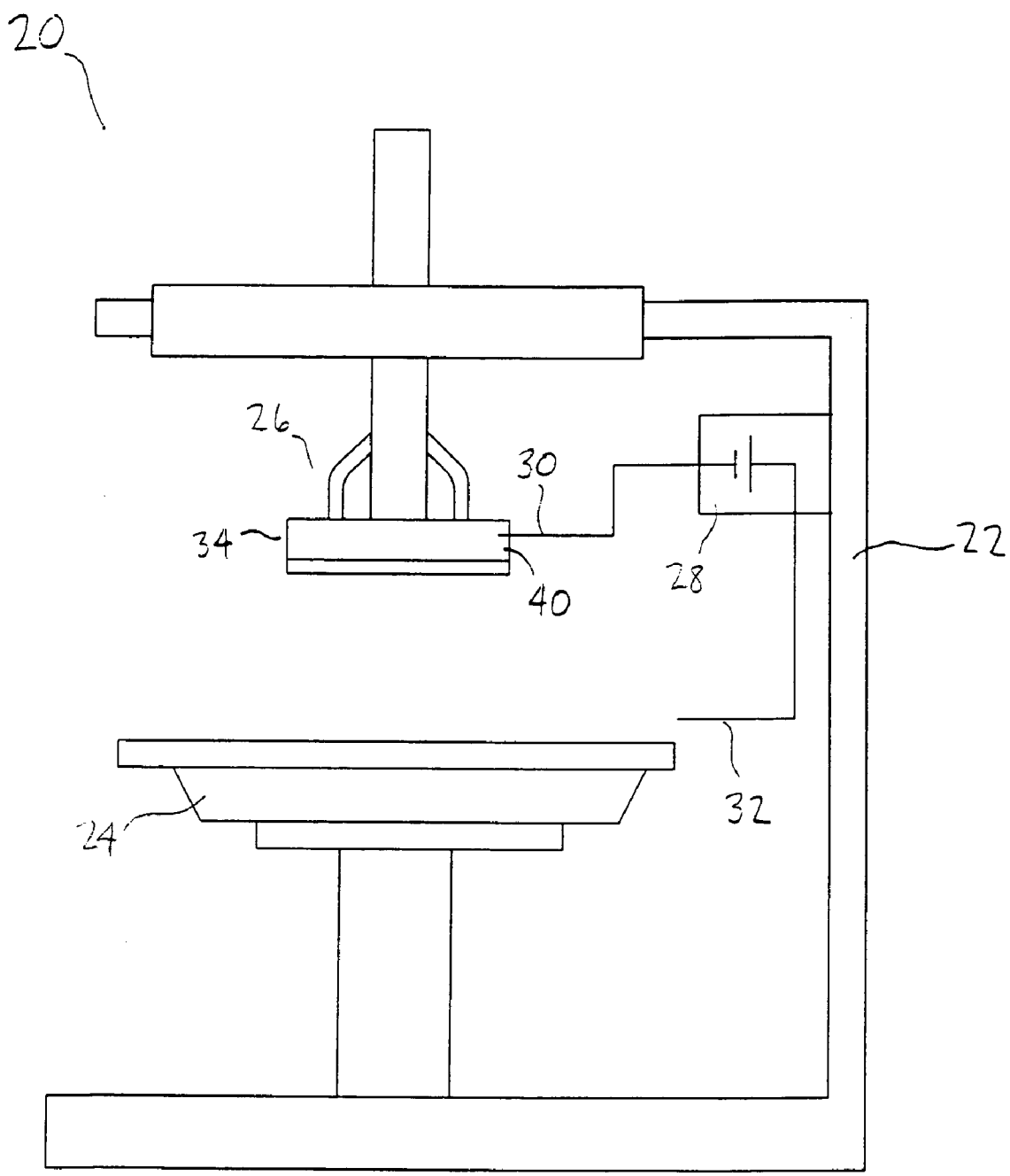
FIG. 1 is cross-sectional schematic view of a semiconductor substrate processing apparatus, including a substrate support, a polish assembly, and a voltage supply.

FIG. 1 illustrates an embodiment of a semiconductor substrate processing, or an electrochemical polish, apparatus 20. The electrochemical polish apparatus 20 may include a frame 22, a substrate support 24, a polish assembly 26, and a voltage supply 28. The substrate support 24 may be connected to a lower portion of the frame 22 and may be able to support semiconductor substrates, such as wafers with diameters of, for example, 200 or 300 mm. The polish assembly 26 may be connected to an upper portion of the frame 22 and may be suspended above the substrate support 24. The polish assembly 26 may include, although not shown in detail, various actuators to allow the polish assembly 26 to be moved relative to the frame 22 and the substrate support 24. The polish assembly 26 may be able to move vertically toward and away from the substrate support 24 and laterally between edges of the substrate support 24.

The voltage supply 28 may be attached to an inner portion of the frame 22 and may include a first electrode 30 and a second electrode 32. The first electrode 30 may be connected to the polish assembly 26, and the second electrode 32 may be suspended near the wafer support 24.

Figure 2:
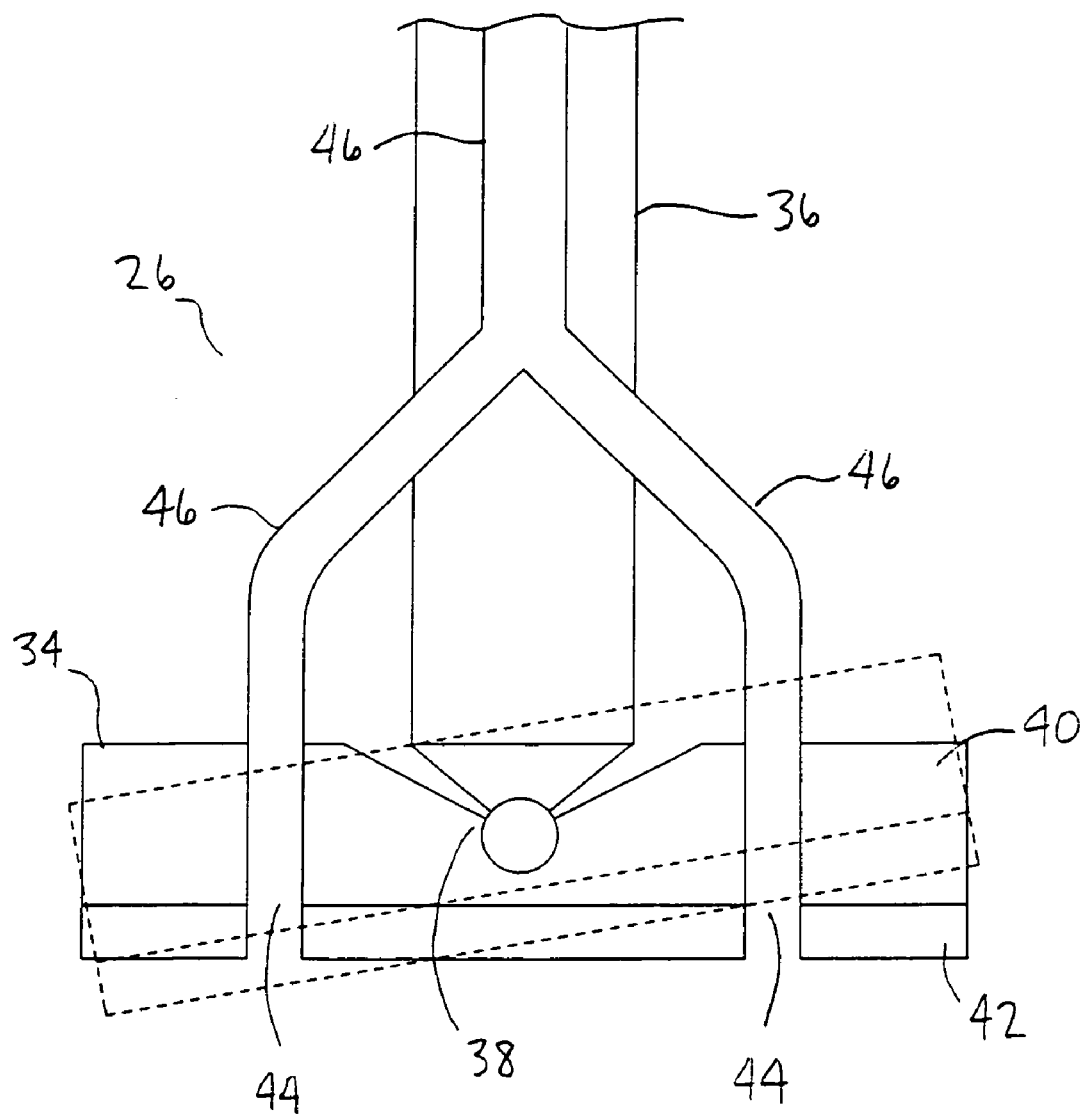
FIG. 2 is a cross-sectional side view of the polish assembly illustrated in FIG. 1.

FIGS. 1 and 2 illustrate the polish assembly 26 in greater detail. The polish assembly 26 may include a polish head 34, a polish arm 36, and a pivot joint 38. Although only illustrated in cross-section, the polish head 34 may be substantially circular in shape and include a conductive piece 40, an insulating pad 42, and fluid channels 44. The polish assembly 26 may be further able to rotate the polish head 34 about a central axis thereof. The conductive piece 40 may be made of a conductive material, such as aluminum. The insulating pad 42 may be attached to a lower surface of the conductive piece 40 and may be made of a course, porous, permeable material, such as an open pore polyurethane film.

The fluid channels 44 may extend vertically through the polish head 34. The polish head 34 may be connected to the polish arm 36 through the pivot joint 38. As illustrated in FIG. 2, the pivot joint 38 may allow the polish head 34 to tilt, or pivot, relative to the polish arm 36.

The polish assembly 26 may also include fluid tubes 46 that are connected to the fluid channels 44 and, although not illustrated, a semiconductor processing fluid supply. Referring to FIG. 1, the polish head 34 may have a width or diameter that is smaller than a width of the substrate support 24.

Figure 3:
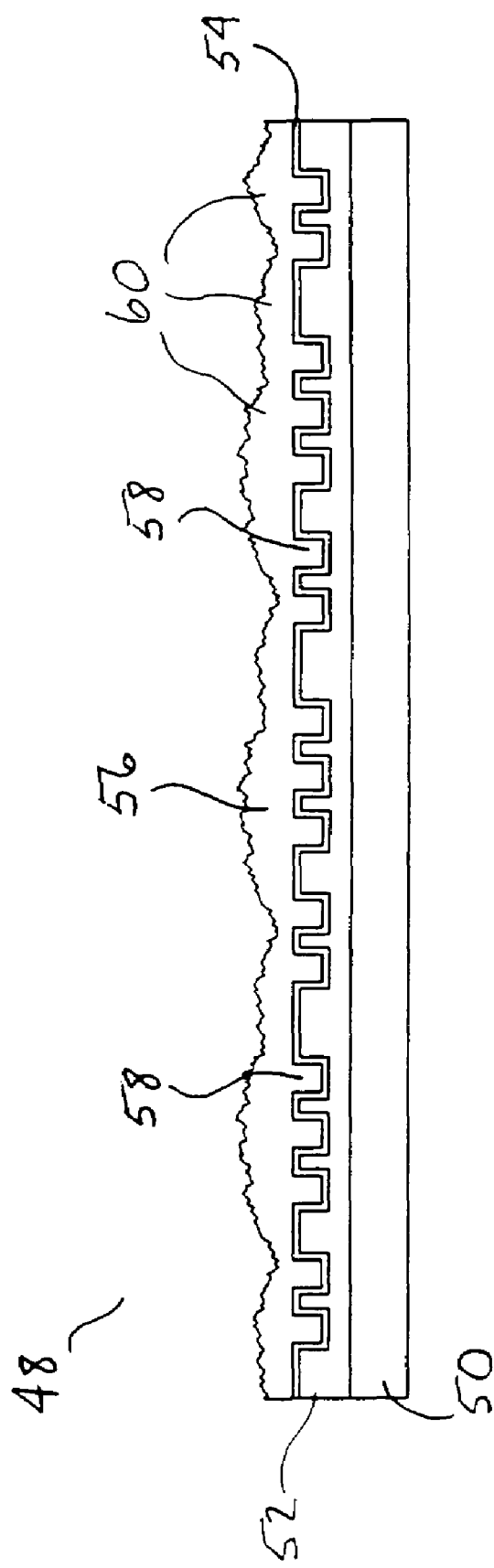
FIG. 3 is a cross-sectional side view of a semiconductor substrate.

FIG. 3 illustrates an example of a semiconductor substrate 48 which may be processed by the electrochemical polish apparatus 20. It should be noted that the semiconductor substrate 48 illustrated in FIG. 3 is only one example of numerous semiconductor substrates that could be processed using the semiconductor substrate processing apparatus 20.

The semiconductor substrate 48 may be a wafer and may include a substrate layer 50, a dielectric layer 52, a barrier layer 54, and a conductive layer 56. The substrate layer 50 may be substantially made of silicon, as is commonly understood in the art. The dielectric layer 52 may be, for example, an low-k inter-layer dielectric, such as a carbon-doped oxide, a hydrogen or oxygen-doped silicon oxide, or an organic based low-k dielectric. The low-k dielectric may have a dielectric constant below 3. The dielectric layer 52 may have a plurality of trenches 58, or other such formations, formed therein. The barrier layer 54 may be formed directly on the dielectric layer 52 and may be made, for example, of a transition metal nitride, such as titanium nitride or tantalum nitride. The conductive layer 56 may be formed on the barrier layer 54 and may completely fill the trenches 58. The conductive layer 56 may be made of a metal, such as copper. The conductive layer 56 may also be made of, for example, cobalt, ruthenium, titanium, titanium nitride, aluminum, tungsten, molybdenum, platinum, and tantalum, as well as alloys of the metals listed above.

Figure 5:
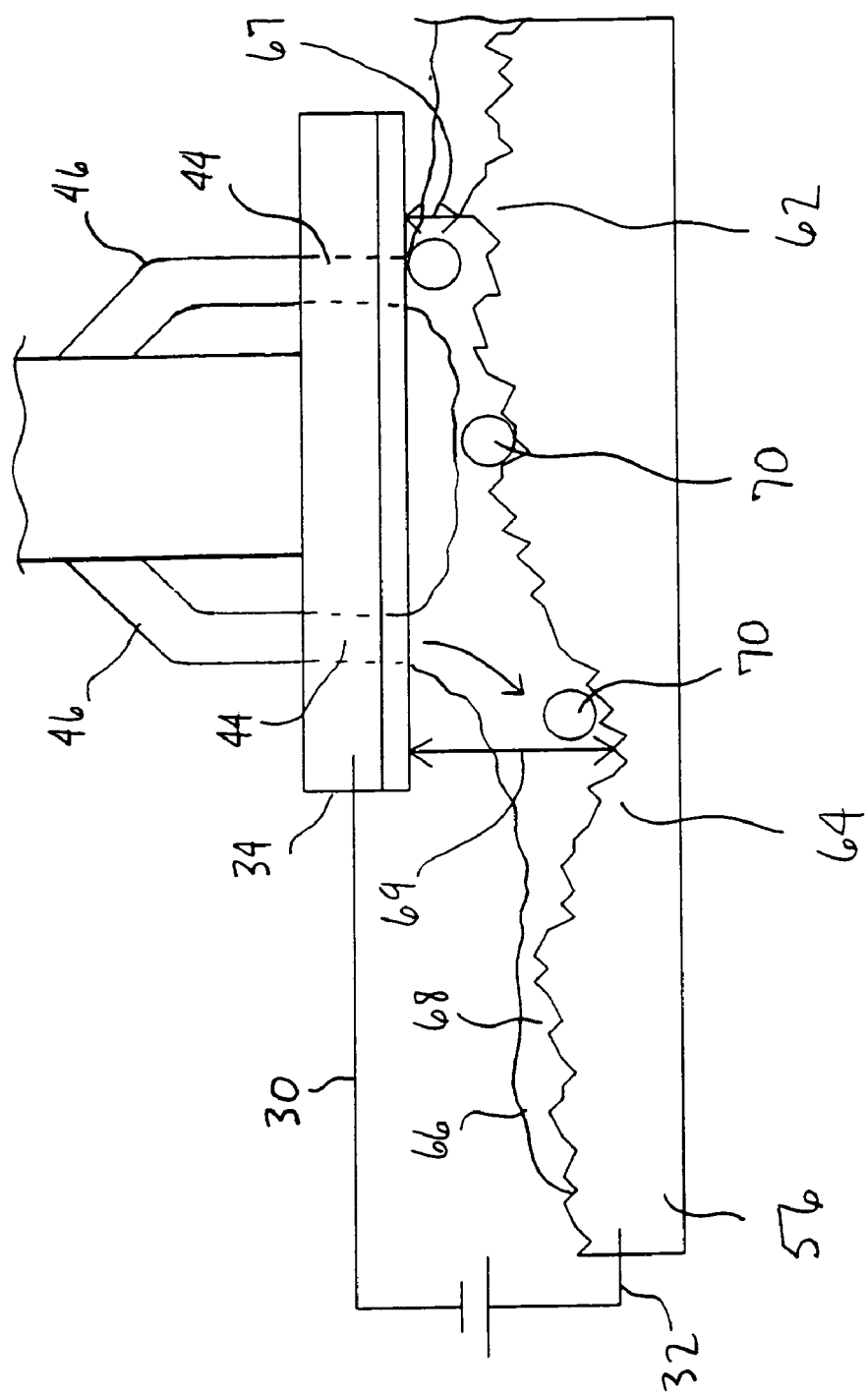
FIG. 5 is a side view of an upper surface of the semiconductor substrate as illustrated in FIG. 4B.

As illustrated in FIGS. 3 and 5, the conductive layer 56 may include a series of alternating raised and recessed roughness formations 60 on an upper surface thereof that include peaks 62 and valleys 64. As illustrated, the roughness formations 60 may be of varying sizes, creating larger and smaller peaks 62 and valleys 64. The smaller valleys 64 may have, for example, widths between approximately 30 nanometers, while the larger valleys may have widths of, for example, approximately 5 millimeters. Additionally, although not illustrated in detail, larger formations may occur from bowing, or warping, of the semiconductor substrate 58 and may have widths, for example, of between 5 millimeters and 5 centimeters.

Figure 4A:
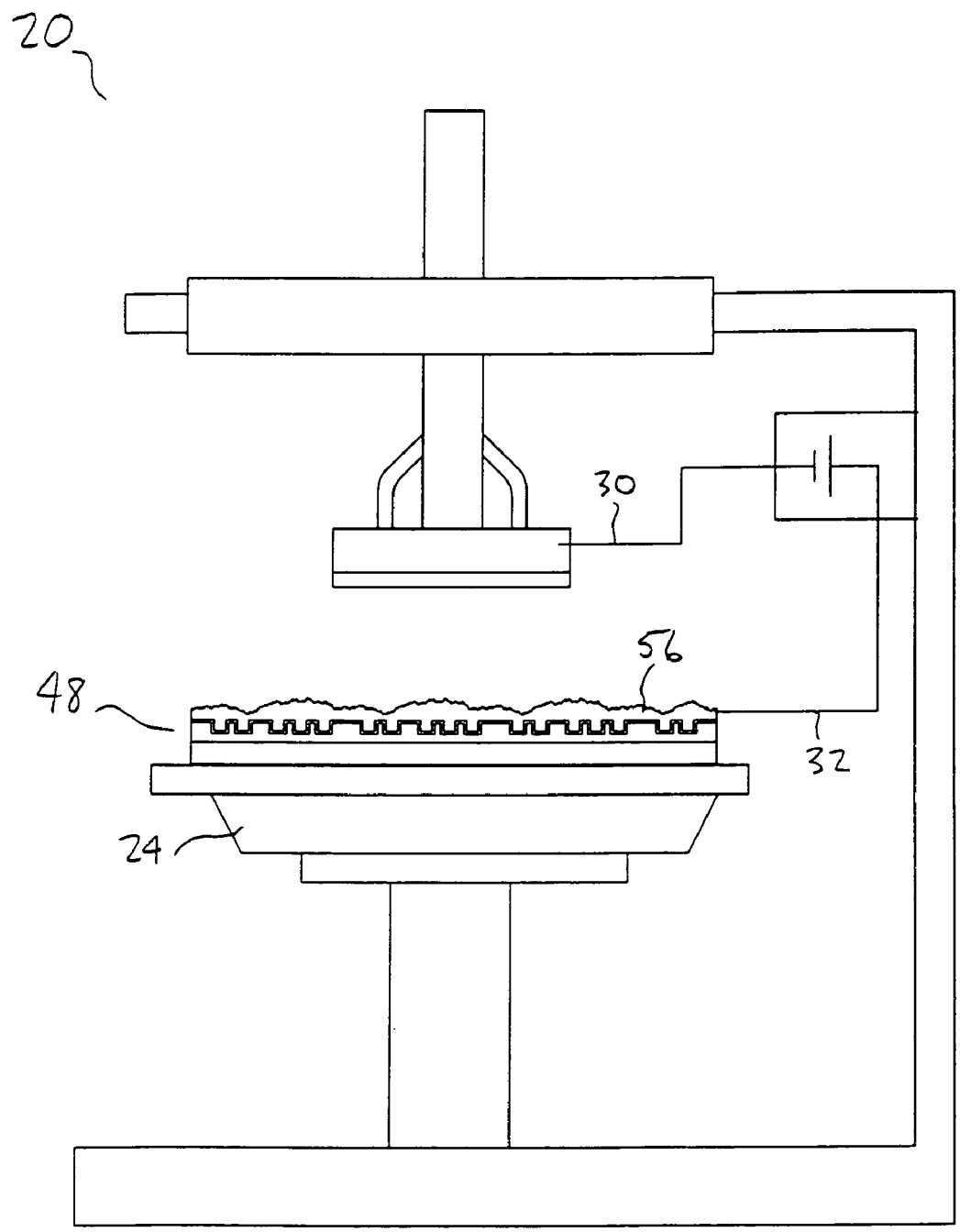
FIGS. 4A and 4B are cross-sectional schematic views of the semiconductor substrate processing apparatus with the semiconductor substrate of FIG. 3 placed therein.
Figure 4B:
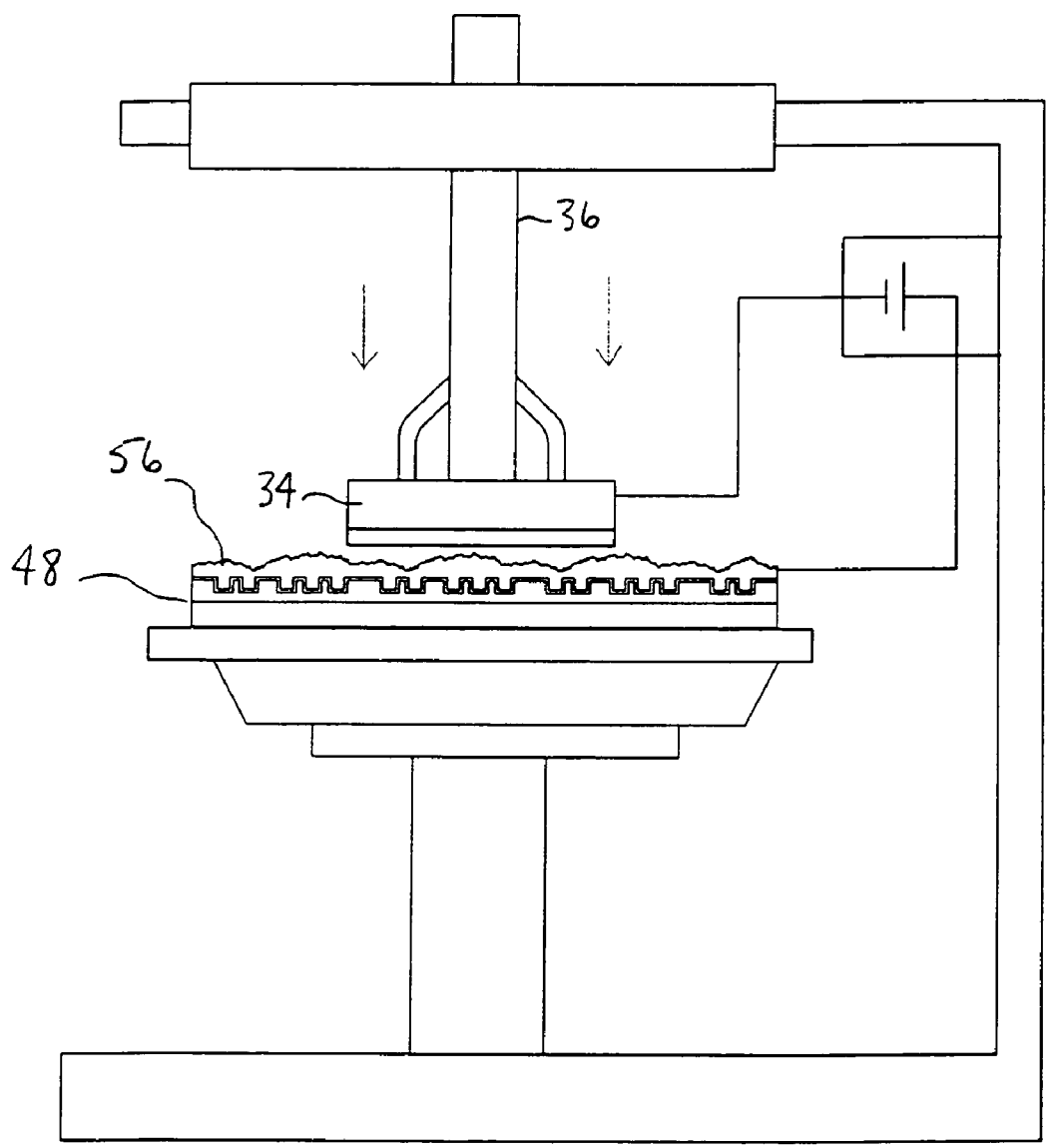

In use, as illustrated in FIGS. 4A and 4B, the semiconductor substrate 48 is placed on the substrate support 24 of the electrochemical polish apparatus 20 with the conductive layer 56 facing the polish head 34. It should be noted that the width of the polish head 34 may be less than the width, or diameter, of the semiconductor substrate 48. In one embodiment, the width of the polish head 34 may be approximately one tenth of the width of the semiconductor substrate 48. The second electrode 32 of the voltage supply 28 may be connected to the conductive layer 56 of the semiconductor substrate 48 by a clamp.

The polish head 34 may then be lowered towards the semiconductor substrate 48.

As illustrated in FIG. 5, the polish head 34 may be positioned over the semiconductor substrate 48 such that the polish head 34 may be at a peak height 67 above the peaks 62 of the conductive layer 56 and a valley height 69 above the valleys 64 of the conductive layer 56. A semiconductor processing fluid 66, or a slurry, may then be dispensed unto the conductive layer 56 through the fluid tubes 46 and the fluid channels 44.

The slurry 66 may include an electrolytic solution 68 and a plurality of abrasive particles 70. The electrolytic solution 68 may be, for example, phosphoric acid. Because of the permeability of the insulating pad 42, the insulating pad 42 may be soaked with the electrolytic solution 68 so that the electrolytic solution 68 contacts the conductive piece 40 of the polish head 34. The abrasive particles 70 may be, for example, ceria, alumina, silica, titania, iron oxide, or polystyrene. The abrasive particles 70 may, for example, be spherical in shape and have diameters, or widths, between 5 mm and 1 mm. As illustrated in FIG. 5, the diameters of the abrasive particles 70 may be approximately the same as the peak height 67.

After the dispensation of the slurry 66 has begun, the polish assembly 26 may be released so that the polish head 34 is resting, with the combined weight of the entire polish assembly 26, on the abrasive particles 70 between the polish head 34 and the peaks 62 of the conductive layer 56. Therefore, the force applied by the polish head 34 on the abrasive particles 70 and semiconductor substrate 48 may be at minimum as such a force may be supplied only by gravity. The abrasive particles 70 between the polish head 34 and the peaks 62 may thus be in contact with the polish head 34 and the conductive layer 56.

Figure 6B:
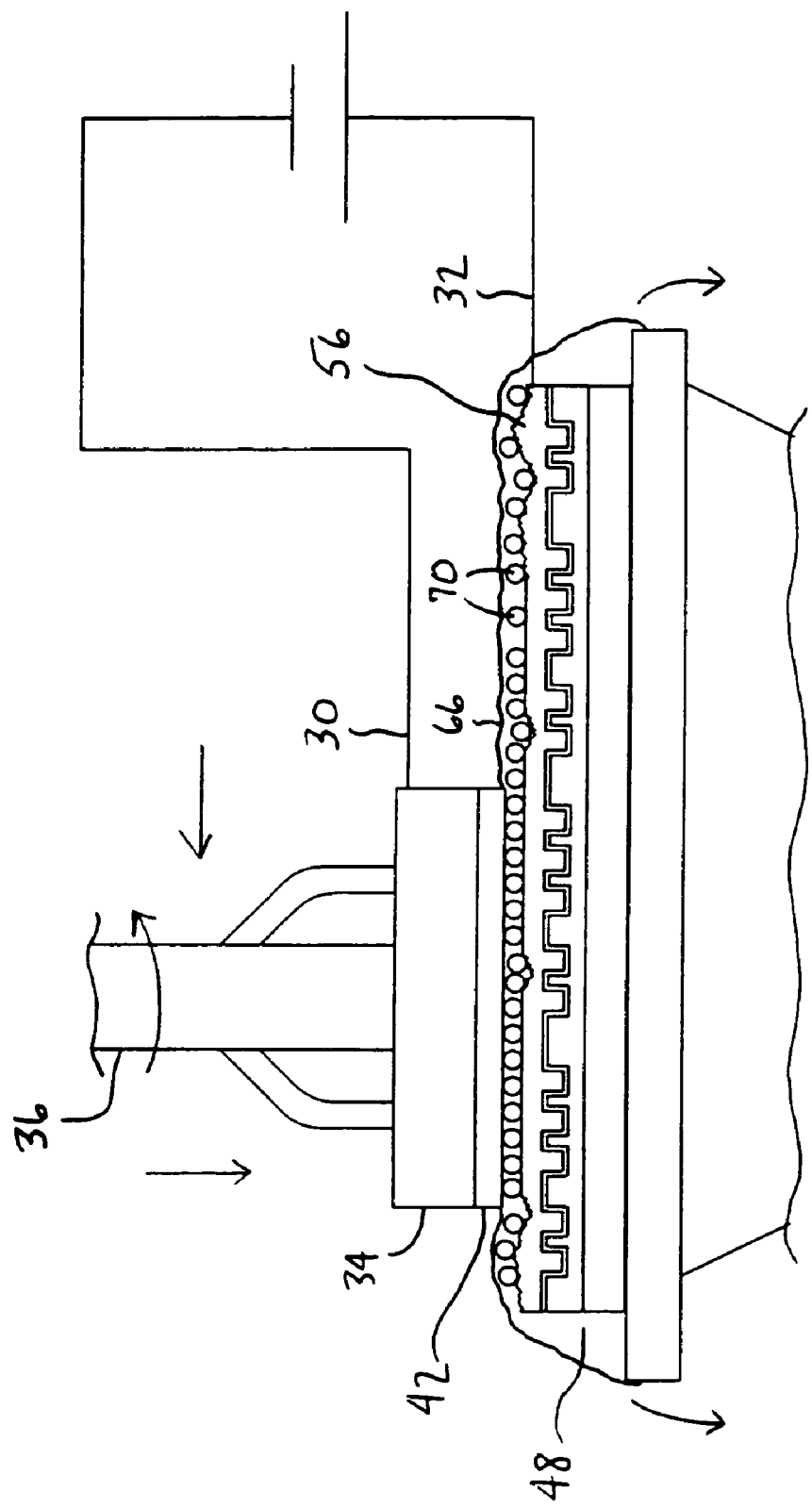

Referring to FIGS. 6A and 6B, a voltage may be applied across the first 30 and second 32 electrodes by the voltage supply 28 while the polish assembly 26 rotates the polish head 34 about the central axis thereof. The polish head may be rotated at a rate of, for example, 500 revolutions per minute (rpm).

The voltage supplied may be between 1.5 and 120 volts. In an embodiment, the voltage supplied may be 1.7 volts. Because of the electrolytic solution 68 is in contact with both the conductive layer 56 and the conductive piece 40 of the polish head 34 and the voltage supplied across the polish head 34 and the conductive layer 56, current may be conducted between the conductive layer 56 and the conductive piece 40 through the electrolytic solution 68. As is commonly understood in the art, metal ions may then be removed from the metal of the conductive layer 56 thereby decreasing the thickness of the conductive layer 56 as material of the conductive layer 56 is removed.

The abrasive particles 70 caught between the peaks 62 of the conductive layer and the polish head 34 may increase the polishing effect of the electrochemical polish apparatus 20. Because the abrasive particles 70 may be in direct contact with the peaks 62 of the conductive layer 56 and the polish head 34, as well as the force of the polish assembly 26 being applied toward the semiconductor substrate 48, the peaks 62 may be polished, or grinded, more quickly than the valleys 64 of the conductive layer 64.

As illustrated in FIG. 6A, the polish head 34 may be placed on a central portion of the semiconductor substrate 48 as the polishing procedure is begun. As illustrated in FIG. 6B, the polish head 34 may then be moved laterally across the semiconductor substrate 48 to the outer portions of the conductive layer 56. The slurry 66 may run off the semiconductor substrate 48, off the substrate support 24, and be either disposed of or recycled. As the slurry 66 runs off the semiconductor substrate 48, additional slurry may be dispensed onto the semiconductor substrate through the polish head 34 in a manner similar to the one discussed above. The slurry 66 may substantially flow off the semiconductor substrate 48 from the central portion to the outer portions thereof. Therefore, any additional hydrogen or oxygen, or other contaminates, that are generated during the polishing process may be removed as the slurry 66 flows off the semiconductor substrate 48.

Still referring to FIG. 6B, because of the combination of the movement of the polish head 34, along with the placement of the abrasive particles 70, and the voltage applied across the polish head 34 and the conductive layer 56, the conductive layer may be polished, or grinded, evenly, creating a substantially planarized upper surface to the semiconductor substrate 48. Although not illustrated in detail, it should be understood that the pivoting action of the polish head 34 may allow the polish head to follow the contours, particularly from warping of the semiconductor substrate 48, to further polish the semiconductor substrate in an even manner.

It should also be understood that the material of the barrier layer 54 may not be able to be removed using a pure electro-polish technique. However, the abrasive particles 70, if so desired, may facilitate the removal of the barrier layer 54 if the rotation and movement of the polish head 34 is continued for a length of time sufficient to completely remove the conductive layer 56.

One advantage is that the abrasive particles maintain a controlled space between the semiconductor wafer and the polish head so that the electro-polishing affect may be controlled. Another advantage is that the abrasive particles mechanically grind the surface of the semiconductor substrate and allow the apparatus to remove materials that are normally not removable using conventional electro-polish machines. A further advantage is that because the peaks of the roughness formations on the conductive layer are grinded more quickly than the valleys, the planarization of the conductive layer is improved. A further advantage is that the abrasive particles increase the polishing affect of apparatus such that the force applied by the polish head onto the substrate may be minimized thereby reducing the normal and shearing forces applied to the semiconductor substrate. A further advantage is that additional contaminates from the polishing process are removed as the slurry flows off the semiconductor substrate.

Other embodiments may utilize polish heads that are made of flexible materials, such as conductive polymers, in order to follow the contours of the semiconductor substrate surface.

FIG. 7A to FIG. 11B illustrate a method for electro-polishing a semiconductor substrate. A semiconductor substrate may be placed in an electrolytic solution. The semiconductor substrate may have a surface, at least a portion of which may be metal. The surface of the semiconductor substrate may be contacted with at least one conductive member. A voltage may be applied across the electrolytic solution and the at least one conductive member. The at least one conductive member may be moved across the surface of the semiconductor substrate causing the electrolytic solution to remove metal ions from the metal when the at least one conductive member contacts the metal portion of the surface of the semiconductor wafer.

Figure 7A:
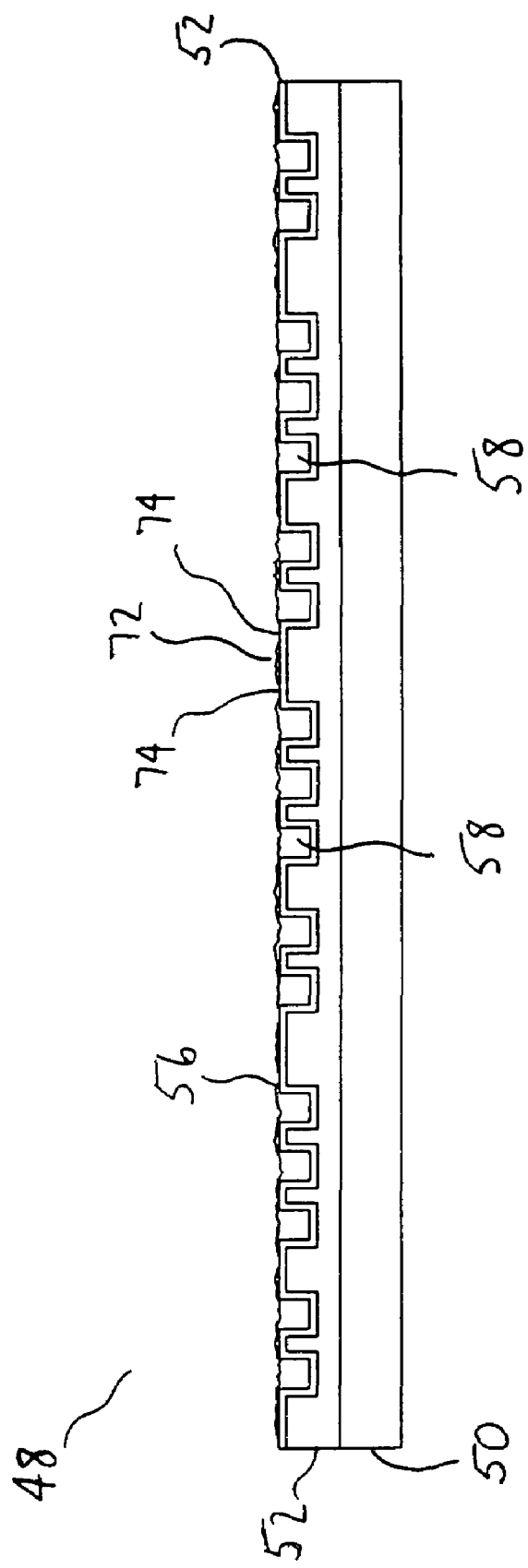
FIG. 7A is a cross-sectional side view of a semiconductor substrate after having undergone an electrochemical polish.
Figure 7B:
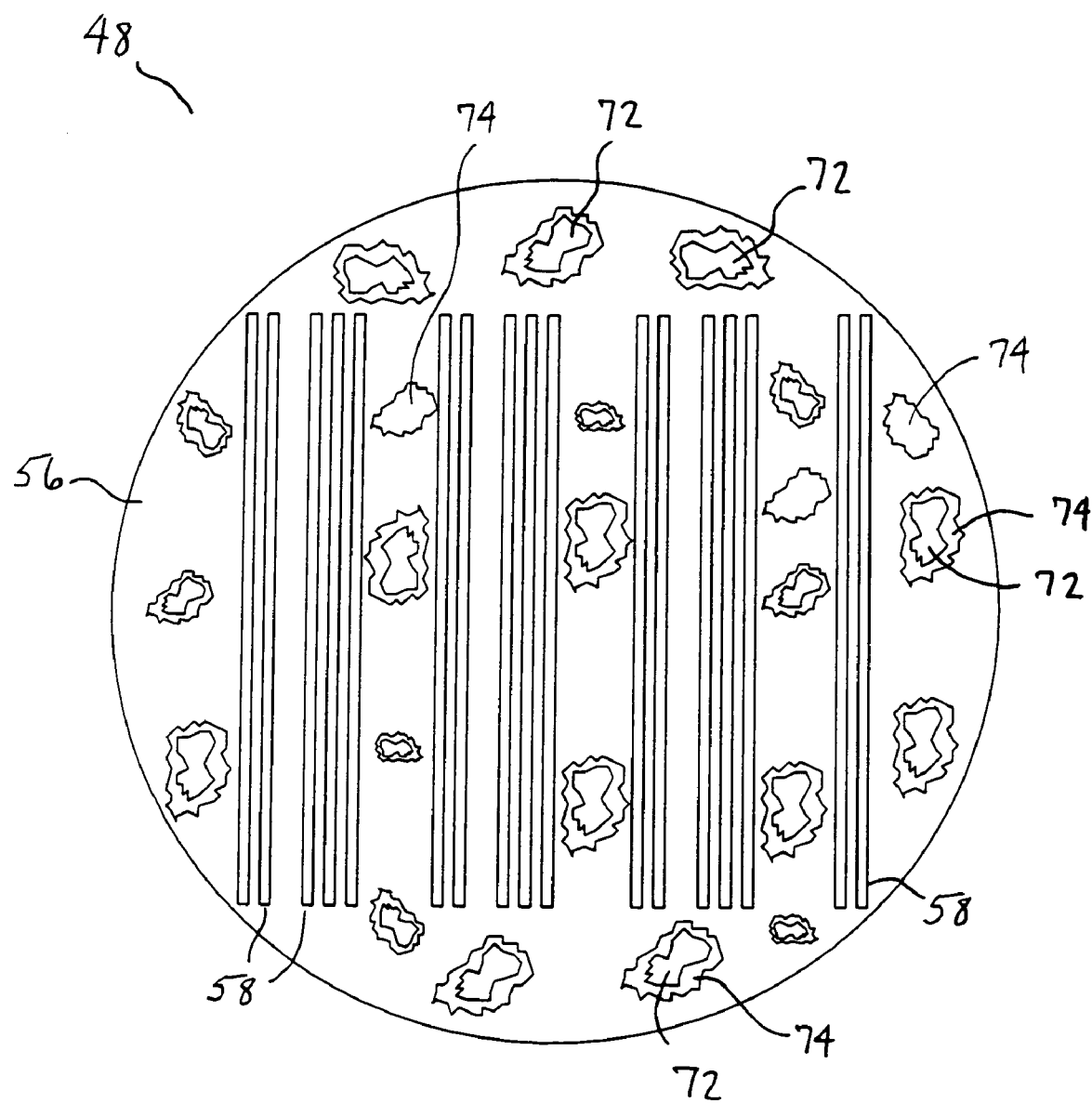
FIG. 7B is a top plan view of the semiconductor substrate as illustrated in FIG. 7A.

FIGS. 7A and 7B illustrate the semiconductor substrate 48 after the substrate 48 has undergone the electrochemical polishing technique illustrated in FIGS. 4A–6B, or a conventional electrochemical polishing technique. As illustrated in FIG. 7A the conductive layer 56 has been substantially thinned, however, the trenches 58 remain substantially filled with the material of the conductive layer 56. As illustrated in FIGS. 7A and 7B, portions of the conductive layer have been completely removed from the barrier layer 54 such that there are exposed portions 74 of the barrier layer 54. Additionally, "islands" of material from the conductive layer 56 may lie within at least some of the exposed portions 74. The islands 72 are electrically separated from the remainder of the conductive layer 56. The exposed portion 74 and islands 72 lie on what is now an upper surface of the semiconductor substrate 48 between and around the trenches 58.

Figure 8:
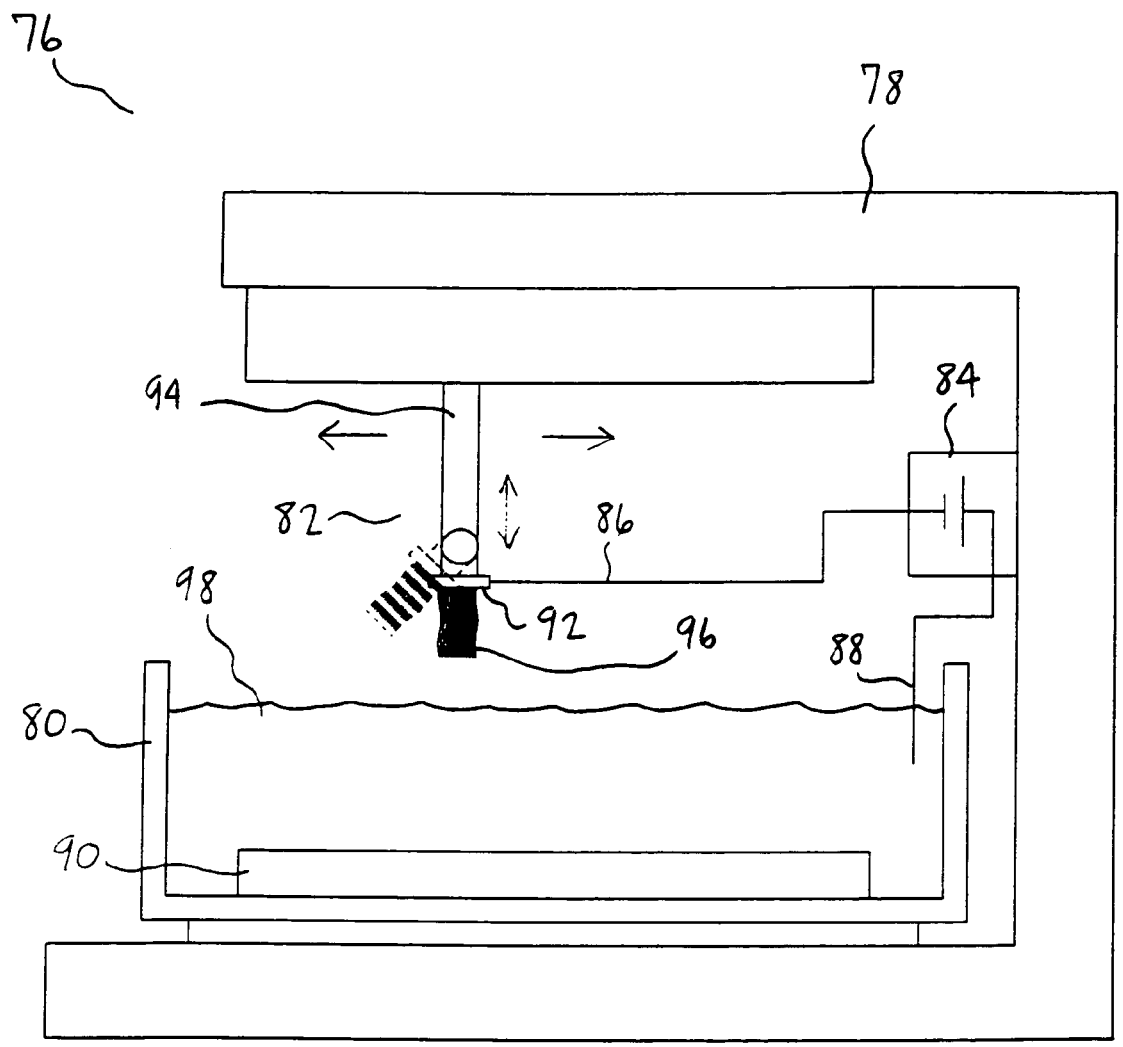
FIG. 8 is a cross-sectional schematic view of a semiconductor substrate processing apparatus, including a solution container, a brush assembly, and a voltage supply.

FIG. 8 illustrates a semiconductor substrate processing, or electro-polishing, apparatus 76. The electro-polishing apparatus 76 may include a frame 78, a solution container 80, a brush assembly 82, and a voltage supply 84. The solution container 80 may be connected to a lower portion of the frame 78. The brush assembly 82 may be connected to an upper portion of the frame 78 and may be able to move vertically towards and away from the solution container 80 and laterally across the solution container 80. The voltage supply 84 may be connected to an inner portion of the frame 78 and may include a first electrode 86 and a second electrode 88. A substrate support 90 may be held within the solution container 80 and may be able to support a semiconductor substrate, such as a wafer, with a diameter of, for example, 200 or 300 mm.

The brush assembly 82 may include a brush head 92, a brush arm 94, and bristles 96. The brush head 92 may be rotatably connected to the brush arm 94, and the bristles 96 may be suspended from the brush head 92. The first electrode 86 may be connected to the brush head 92 so that the first electrode 86 is electrically connected to the bristles 96. The bristles 96 may be made of a conductive material, such as platinum.

The second electrode 88 may be suspended within the solution container 80 and be electrically connected to the solution 98.

Figure 9A:
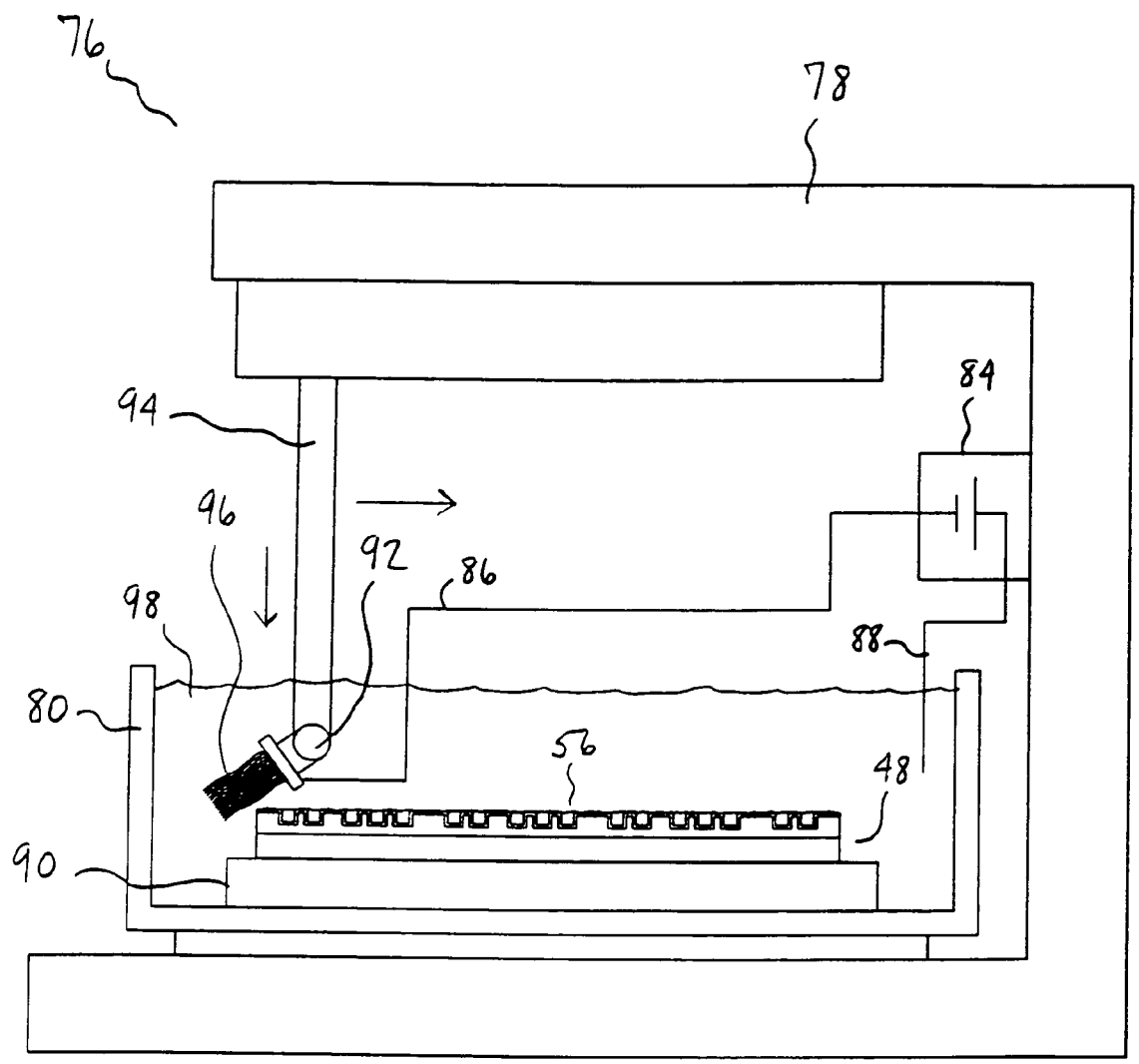
FIG. 9A is a cross-sectional schematic view of the semiconductor substrate processing apparatus as illustrated in FIG. 8 with the semiconductor substrate as illustrated in FIGS. 7A and 7B placed therein.
Figure 9B:
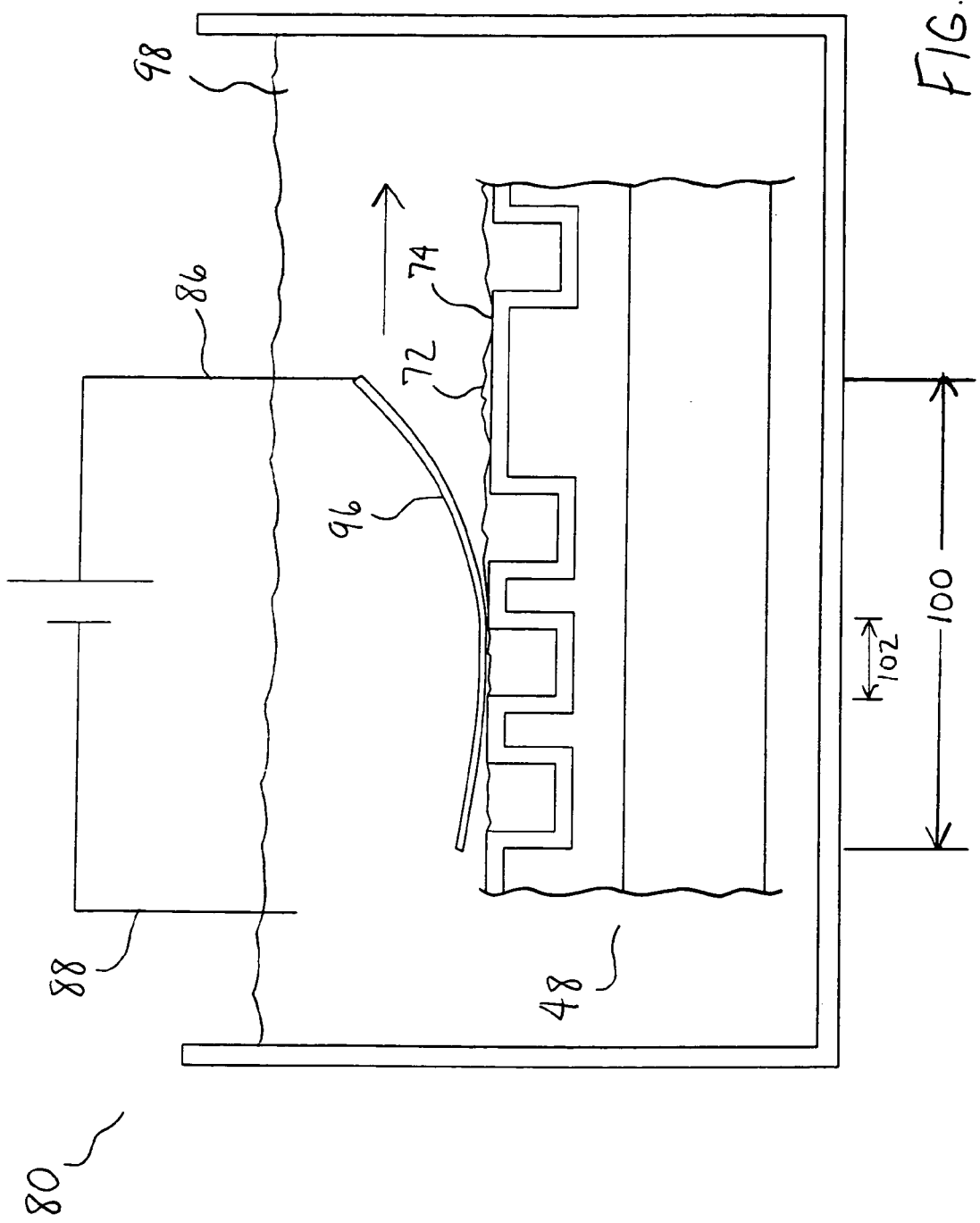
FIG. 9B is a cross-sectional schematic view of the solution container and semiconductor substrate as illustrated in FIG. 9A.

In use, as illustrated in FIG. 9A, the semiconductor substrate 48 is placed on the substrate support 90 and completely immersed in the solution 98. The brush head 92 may be lowered to a first edge 99 of the semiconductor substrate 48 to a height where the bristles 96 will contact the semiconductor substrate 48. As illustrated in FIGS. 9A and 9B, the brush head 92 may then be moved, or swept, across the upper surface of the semiconductor substrate 48.

While the brush head 92 is moved across the semiconductor substrate 48 a voltage may be applied across the first 86 and second 88 electrodes. The voltage applied may be between 1.5 and 120 volts. Referring specifically to FIG. 9B, the bristles 96 have a length 100 which may be several times greater than a width 102 of the trenches 58. A first portion of the bristles 96 may not contact the semiconductor substrate 48. A second portion of the bristles 96 may directly contact the upper surface of the semiconductor substrate 48. Because of the length 100 of the bristles 96, as well as the flexibility of the bristles and the pivoting action of the brush head 92, no portion of the bristles 96 contacts the conductive material within the trenches 58.

As the bristles 96 are moved across the semiconductor substrate 48, any remaining portion of the conductive layer 56, or any portion of the conductive layer 56 electrically connected thereto, will undergo an electro-polish while the bristles 96 are in electrical contact therewith.

Figure 10A:
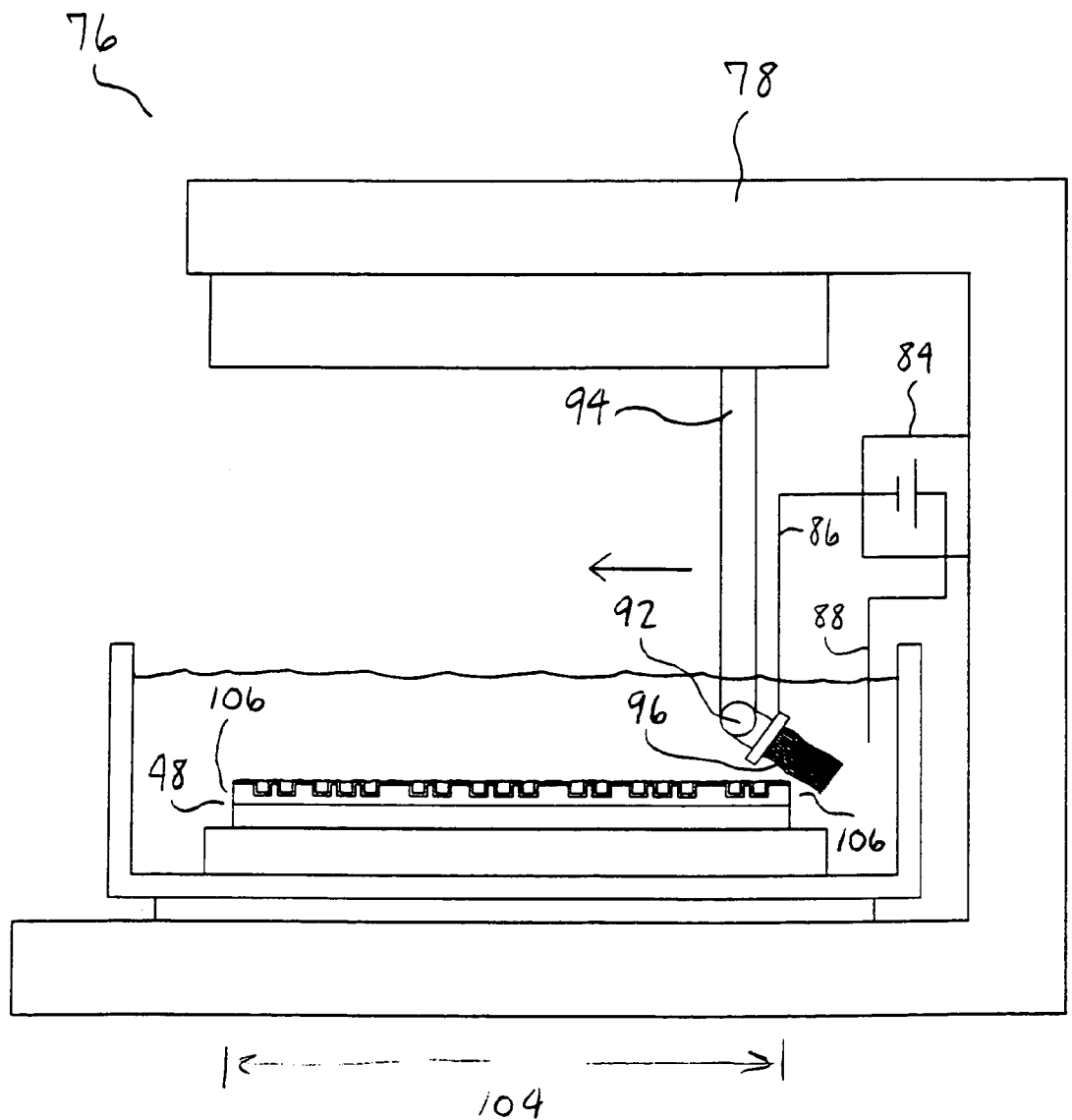
FIG. 10A is a cross-sectional schematic view of the semiconductor substrate processing apparatus similar to FIG. 9A.

As illustrated in FIGS. 10A and 10B, after the brush head 92 is moved across the entire diameter of the semiconductor substrate 48, to a second edge 99 thereof, the brush head 96 may be moved across the semiconductor substrate 48 in an opposite direction. Again, because of the length 100 of the bristles 96, as well as the flexible nature of the bristles 96 and the pivoting action of the brush head 92, no portion of the bristles 96 contacts the conductive material within the trenches 58.

The process illustrated in FIGS. 9A–10B may be repeated multiple times until substantially all of the conductive material of the conductive layer 56 have been removed, except for the conductive material in the trenches 58. It should be understood that the material of the conductive layer 56 within the trenches 58 may become electrically separated from the remainder of the conductive layer 56 as the conductive layer 56 around the trenches 58 completely dissolves.

Figure 11B:
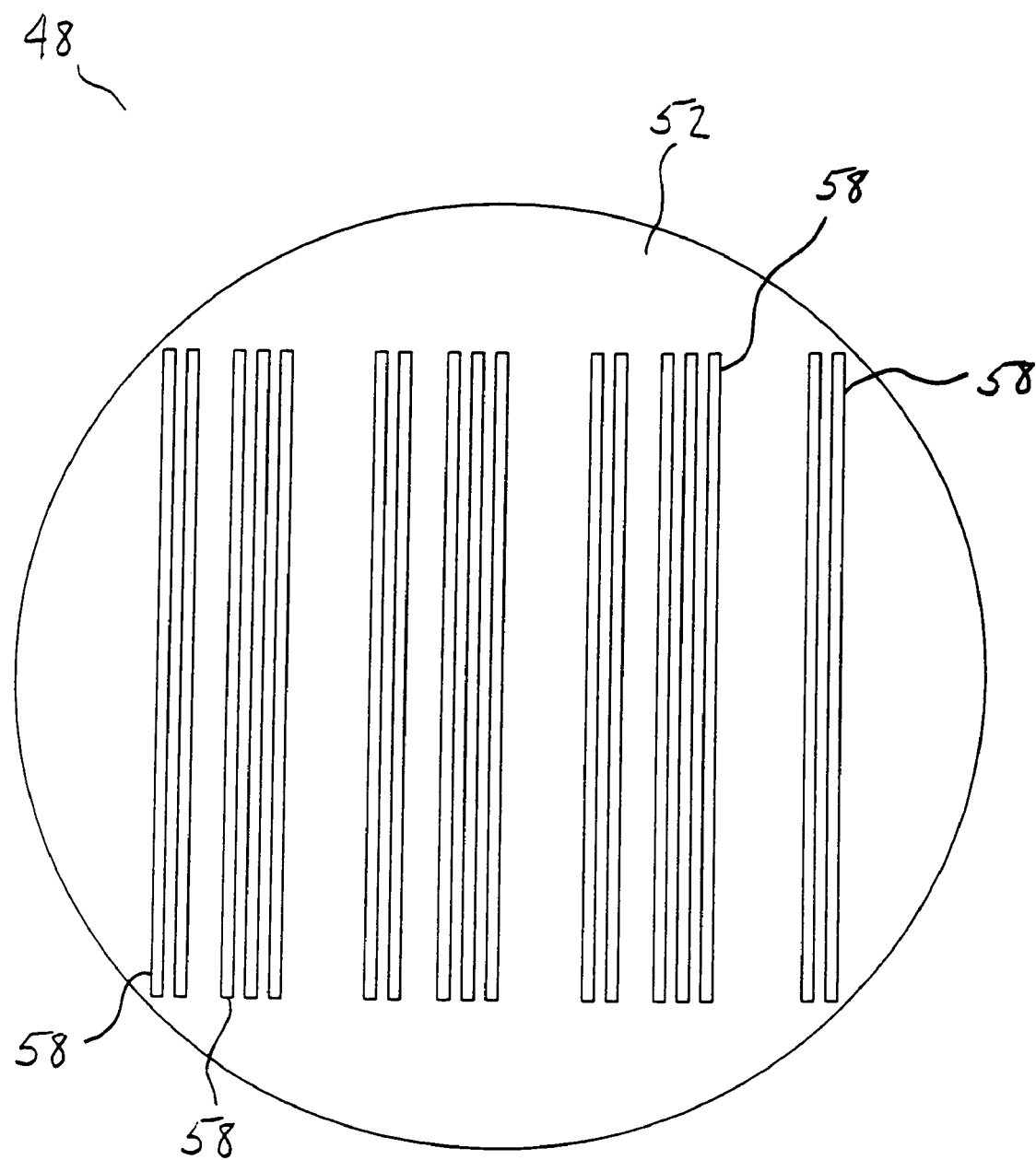
FIG. 11B is a top plane view of the semiconductor substrate as illustrated in FIG. 11A.

FIGS. 11A and 11B illustrate the semiconductor substrate 48 after having undergone the electrochemical polishing technique illustrated in FIGS. 9A–10B. As shown, the upper surface of the semiconductor substrate 48 is substantially free of all conductive material from the conductive layer 56. The trenches 58, however, remain substantially filled with the conductive material from the conductive layer 56.

One advantage is that the islands of the conductive layer may be removed while not affected the conductive material within the trenches. Another advantage is that substantially all of the conductive layer can be removed while only applying minimal mechanical forces on the semiconductor substrate. Therefore, any materials of the semiconductor substrate, such as mechanically weak, or sensitive, low-k materials, will not be damaged by mechanical stresses.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method comprising:
    positioning a polish head a distance from a surface of semiconductor substrate;
    placing a semiconductor substrate processing fluid between the surface of the semiconductor substrate and the polish head, the semiconductor substrate processing fluid having a plurality of abrasive particles therein, the abrasive particles having width being approximately the same as the distance, at least some of the abrasive particles contacting the surface of the semiconductor substrate and the polish head; and
    moving the polish head relative to the surface of the semiconductor substrate to cause the abrasive particles to polish the surface of the semiconductor substrate.

2. The method of claim 1, wherein the polish head and the surface of the semiconductor substrate comprise an electrically conductive material.

3. The method of claim 2, wherein the semiconductor substrate processing fluid further comprises an electrolytic solution.

4. The method of claim 3, wherein the polish head further comprises an insulating material between the electrically conductive material of the polish head and the electrolytic solution.

5. The method of claim 4, further comprising applying a voltage across the metal of the surface of the semiconductor substrate and the electrically conductive material of the polish head, said application of the voltage causing the electrolytic solution to remove metal ions from the metal.

6. The method of claim 5, wherein the polish head has a polish head width and the semiconductor substrate has a semiconductor substrate width, the polish head width being less than the semiconductor substrate width.

7. The method of claim 6, wherein the surface of the semiconductor substrate comprises a plurality of alternating raised and recessed formations.

8. The method of claim 7, wherein the at least some of the abrasive particles contacting the surface of the semiconductor substrate and the polish head lie directly between the polish head and a raised formation of the surface of the semiconductor substrate.

9. The method of claim 8, wherein the polish head applies a force on the at least some of the abrasive particles, the force being supplied by gravity.

10. The method of claim 9, wherein the metal includes at least one of copper, cobalt, ruthenium, titanium, titanium nitride, aluminum, tungsten, molybdenum, platinum, and tantalum.

11. The method of claim 10, wherein the electrolytic solution includes phosphoric acid.

12. The method of claim 11, wherein the abrasive particles are spherical and include at least one of ceria, alumina, silica, titania, iron oxide, and polystyrene.

13. A method comprising:
    placing a semiconductor substrate in an electrolytic solution, the semiconductor substrate having a surface, at least a portion of the surface being metal;
    contacting the surface of the semiconductor substrate with at least one conductive member;
    applying a voltage across electrolytic solution and the at least one conductive member; and
    moving the at least one conductive member across the surface of the semiconductor substrate, the electrolytic solution removing metal ions from the metal when the at least one conductive member contacts the metal portion of the surface of the semiconductor wafer.

14. The method of claim 13, wherein the surface of the semiconductor substrate has a plurality of cavities formed thereon, the cavities being substantially filled with metal and having a cavity width.

15. The method of claim 14, wherein the at least one conductive member has a member length and a member width, the member length being a multiple of the member width.

16. The method of claim 15, wherein the at least one conductive member has a first portion and a second portion, the second portion being substantially adjacent to the surface of the semiconductor substrate and having a contact length being greater than the cavity width.

17. The method of claim 16, wherein the at least a portion of the surface comprises a plurality of metallic portions being electrically separated from one another.

18. The method of claim 17, wherein the at least one conductive member comprises a plurality of flexible metal wires.

19. The method of claim 18, wherein the metal of the surface of the semiconductor substrate includes at least one of copper, cobalt, ruthenium, titanium, titanium nitride, aluminum, tungsten, molybdenum, and platinum.

20. The method of claim 19, wherein the semiconductor substrate is a semiconductor wafer.

21. A method comprising:
    contacting a polish head with a surface of semiconductor substrate, the semiconductor substrate having a surface, at least a portion of the surface being metal;
    moving the polish head relative to the surface of the semiconductor substrate to cause the polish head to polish the surface of the semiconductor substrate;
    placing the semiconductor substrate in an electrolytic solution;
    contacting the surface of the semiconductor substrate with at least one conductive member;
    applying a voltage across electrolytic solution and the at least one conductive member; and
    moving the at least one conductive member across the surface of the semiconductor substrate, the electrolytic solution removing metal ions from the metal when the at least one conductive member contacts the metal portion of the surface of the semiconductor wafer.

22. The method of claim 21, wherein the surface of the semiconductor substrate has a plurality of cavities formed thereon, the cavities being substantially filled with metal and having a cavity width.

23. The method of claim 22, wherein the at least one conductive member has a member length and a member width, the member length being a multiple of the member width.

24. The method of claim 23, wherein the at least one conductive member has a first portion and a second portion, the second portion being substantially adjacent to the surface of the semiconductor substrate and having a contact length being greater than the cavity width.

25. The method of claim 24, wherein the at least a portion of the surface comprises a plurality of metallic portions being electrically separated from one another.

* * * * *